United States Patent
Straayer et al.

(10) Patent No.: US 8,138,843 B2
(45) Date of Patent: Mar. 20, 2012

(54) GATED RING OSCILLATOR FOR A TIME-TO-DIGITAL CONVERTER WITH SHAPED QUANTIZATION NOISE

(75) Inventors: Matthew Straayer, Acton, MA (US); Michael Perrott, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 62 days.

(21) Appl. No.: 11/854,615

(22) Filed: Sep. 13, 2007

(65) Prior Publication Data

US 2008/0069292 A1 Mar. 20, 2008

Related U.S. Application Data

(60) Provisional application No. 60/844,742, filed on Sep. 15, 2006.

(51) Int. Cl.
*H03K 3/03* (2006.01)
*G01R 23/175* (2006.01)
*G04F 10/04* (2006.01)

(52) U.S. Cl. ......... 331/57; 331/45; 324/76.54; 368/118; 368/120

(58) Field of Classification Search ............ 331/45, 331/57; 324/76.54; 356/5.01–5.03; 341/155, 341/166; 368/113, 118, 120; 702/189
See application file for complete search history.

(56) References Cited

U.S. PATENT DOCUMENTS

| | | | |
|---|---|---|---|
| 4,164,666 A * | 8/1979 | Hirasawa | 326/97 |
| 4,719,608 A | 1/1988 | Genat et al. | |
| 5,166,959 A * | 11/1992 | Chu et al. | 377/20 |
| 5,534,809 A * | 7/1996 | Watanabe et al. | 327/269 |
| 5,812,626 A * | 9/1998 | Kusumoto et al. | 377/20 |
| 5,892,670 A * | 4/1999 | Lacey et al. | 363/60 |
| 6,111,456 A * | 8/2000 | Saito et al. | 327/541 |
| 6,204,694 B1 * | 3/2001 | Sunter et al. | 326/93 |
| 6,377,093 B1 | 4/2002 | Lee et al. | |
| 6,429,693 B1 | 8/2002 | Staszewski et al. | |
| 6,501,706 B1 | 12/2002 | West | |
| 6,751,641 B1 | 6/2004 | Swanson | |
| 6,754,613 B2 | 6/2004 | Tabatabaei et al. | |
| 7,304,510 B2 * | 12/2007 | Matsuta | 327/3 |
| 7,332,973 B2 * | 2/2008 | Lee et al. | 331/25 |
| 2002/0191727 A1 | 12/2002 | Staszewski et al. | |
| 2004/0246007 A1 | 12/2004 | Fallot-Burghardt | |
| 2005/0259239 A1 | 11/2005 | Lin et al. | |
| 2006/0103566 A1 | 5/2006 | Vemulapalli et al. | |

OTHER PUBLICATIONS

International Search Report for PCT/US07/78363 dated Mar. 13, 2008; 2 Pages.

* cited by examiner

*Primary Examiner* — Levi Gannon
(74) *Attorney, Agent, or Firm* — Gesmer Updegrove LLP

(57) ABSTRACT

Described is a compact, lower power gated ring oscillator time-to-digital converter that achieves first order noise shaping of quantization noise using a digital implementation. The gated ring oscillator time-to-digital converter includes a plurality of delay stages configured to enable propagation of a transitioning signal through the delay stages during an enabled state and configured to inhibit propagation of the transitioning signal through the delay stages during a disabled state. Delay stages are interconnected to allow sustained transitions to propagate through the delay stages during the enabled state and to preserve a state of the gated ring oscillator time-to-digital converter during the disabled state. The state represents a time resolution that is finer than the delay of at least one of the delay stages. A measurement module determines the number of transitions of the delay stages.

9 Claims, 10 Drawing Sheets

GATED RING OSCILLATOR FOR A TIME-TO-DIGITAL CONVERTER WITH SHAPED QUANTIZATION NOISE

RELATED APPLICATIONS

This application claims the benefit of the earlier filing date of U.S. Provisional Patent Application Ser. No. 60/844,742, filed Sep. 15, 2006, titled "Method and Apparatus for Efficient Scrambling and/or Frequency Noise Shaping of Time-to-Digital Converter Quantization Noise", the entirety of which is incorporated herein by reference.

FIELD OF THE INVENTION

The present invention relates generally to time-to-digital converters. More particularly, the invention relates to a gated ring oscillator for frequency noise shaping of time-to-digital quantization noise.

BACKGROUND OF THE INVENTION

New generations of CMOS IC processes provide faster transistors with greater circuit density; however, many traditional analog characteristics are sacrificed. Consequently, circuit designers have pursued new mixed-signal circuit architectures that take advantage of digital circuits to augment analog processing of signals. In particular, digital phase locked loops (PLLs) have benefited from the use of time, rather than voltage or current, as a signal domain.

A time-to-digital converter (TDC) is used to quantify time information of a signal event with respect to a reference event. Traditionally, TDCs have been used in applications in experimental physics and laser range finding. More recently, fully integrated TDCs have been investigated as a core building block for a variety of clocking and phase-locked loop systems and applications.

A typical TDC operates as shown in FIG. 1. The time difference $t_{in}$ to be measured is defined by the difference between a reference signal edge occurring at a time $t_{ref}$ and an event signal edge occurring at a time $t_{event}$. To obtain a quantitative measurement of $t_{in}$, time is segmented into discrete steps according to the timing resolution $t_{res}$ of the TDC. A measured time difference $t_{out}$ is provided by the TDC to approximate $t_{in}$ with some quantization error $t_q$, where $t_q = t_{out} - t_{in}$.

A TDC 10 is commonly implemented with standard digital circuit elements as shown in FIG. 2. The reference signal is propagated through a serial configuration of delay stages 14A to 14J (generally 14, only three shown for clarity). In time, the reference signal edge moves from left to right in the figure, from the first delay stage 14A to the last delay stage 14J. At a rising event signal edge, the states of all the delay elements 14 are clocked into respective serial registers 18A to 18K (generally 18). The output time $t_{out}$ of the TDC 10 is determined according to the product of a positive integer output $N_{out}$ and the delay $t_{res}$ of a single delay stage 14. Thus the minimum resolution of the TDC 10 is limited by process technology. The quantization error of the TDC has a substantially white spectrum although practical applications can exhibit quantization noise with significant tone content for certain input signals.

A vernier delay TDC is based on a variation of the conventional TDC structure and achieves an improvement in the resolution of the TDC. An example of a vernier delay TDC 20 is shown in FIG. 3. The reference signal edge propagates through the serial configuration of delay elements 14. The event signal edge propagates through a separate serial configuration of delay elements 22A to 22J (generally 22). The delay $t_{delay}$ caused by each delay element 14 in the propagation path for the reference signal edge is slightly greater by a time $t_{offset}$ than the delay of each delay element 22 in the propagation path for the event signal edge. Thus, if the reference signal edge occurs first and the two edges propagate through their respective delay elements 14 and 22, the event signal edge slowly catches up to the reference signal edge. Ideally, the vernier delay TDC 20 improves the time resolution by $t_{delay}/t_{offset}$. Mismatches within the propagation paths and thermal noise contributed by the registers 18 limits the minimum TDC resolution. In addition, the number of delay elements 14 and 22 required for a maximum acceptable input time difference increases compared to a standard TDC, thereby reducing throughput and making the vernier delay TDC 20 unsuitable for applications requiring a large dynamic range.

The noise performance of a TDC can be an obstacle for meeting the noise requirements of many applications, including applications based on current wireless communications standards. To reduce the effect of a high TDC resolution, the bandwidth of a PLL can be reduced. The reduced bandwidth sacrifices utility such as the option to modulate a data stream within the PLL that is not otherwise possible without a significant reduction in the TDC resolution. Improved TDC resolution is not likely to be realized soon through processing technology advances and the vernier delay TDC 20 is not a practical option for many applications due to its inherent circuit complexity.

What is needed is a TDC that overcomes the problems and limitations described above. The present invention satisfies this need and provides additional advantages.

SUMMARY OF THE INVENTION

In one aspect, the invention features a gated ring oscillator time-to-digital converter for modifying time-to-digital converter quantization noise. The gated ring oscillator time-to-digital converter includes a plurality of delay stages configured to enable propagation of a transitioning signal through the delay stages during an enabled state and configured to inhibit propagation of the transitioning signal through the delay stages during a disabled state. The delay stages are interconnected to allow sustained transitions to propagate through the delay stages during the enabled state and to preserve a state of the gated ring oscillator time-to-digital converter during the disabled state. The state represents a time resolution that is finer than the delay of at least one of the delay stages. The gated ring oscillator time-to-digital converter also includes a measurement module to determine a number of transitions of the delay stages.

In another aspect, the invention features a method for determining a measurement time. The measurement time has a plurality of enable periods to be included in the determination and at least one disable period to be excluded from the determination. The method includes enabling propagation of a transitioning signal through a plurality of delay stages at a first enable time. The delay stages are interconnected to allow sustained transitions to propagate through the delay stages during the enabled state and preservation of a state of the delay stages during a disabled state. The propagation of the transitioning signal through the delay stages is disabled at a disable time and the state of the delay stages at the disable time is stored. Propagation of the transitioning signal through the delay stages is enabled at a second enable time. The propagation resumes at the state of the delay stages at the disable time. The state represents a time resolution that is finer than the delay of at least one of the delay stages.

BRIEF DESCRIPTION OF THE DRAWINGS

The above and further advantages of this invention may be better understood by referring to the following description in conjunction with the accompanying drawings, in which like numerals indicate like structural elements and features in the various figures. For clarity, not every element may be labeled in every figure. The drawings are not necessarily to scale, emphasis instead being placed upon illustrating the principles of the invention.

DETAILED DESCRIPTION

In brief overview, the invention relates to gated ring oscillator TDC for modifying time-to-digital converter quantization noise. The spectral density of the quantization noise of the TDC is substantially reduced relative to classical TDC architectures with the same timing resolution. The TDC can be fabricated as a small area of an integrated circuit having low power requirements. Products requiring high timing accuracy can realize significant advantages with the TDC of the present invention. By way of example, such products include wireless communication devices (e.g., cell phones and local area networks), field programmable gate arrays, microprocessors, microcontrollers and digital signal processors, high-speed application specific integrated circuits (ASICs), routers and high-speed serial links.

Figure 1:
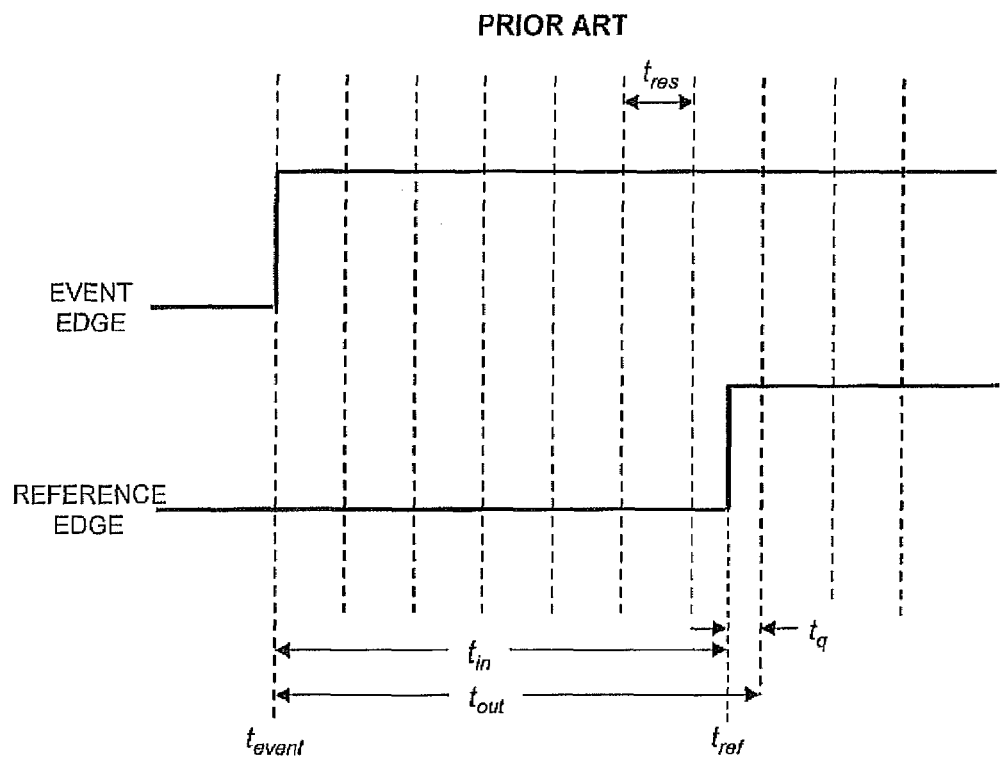
FIG. 1 shows the timing relationship for a typical TDC.
Figure 2:
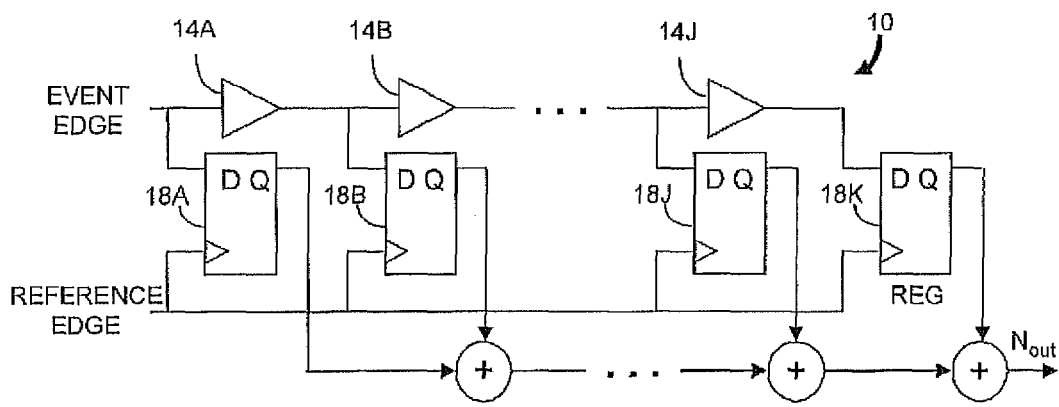
FIG. 2 is a diagram of a conventional TDC employing standard digital circuit elements.
Figure 3:
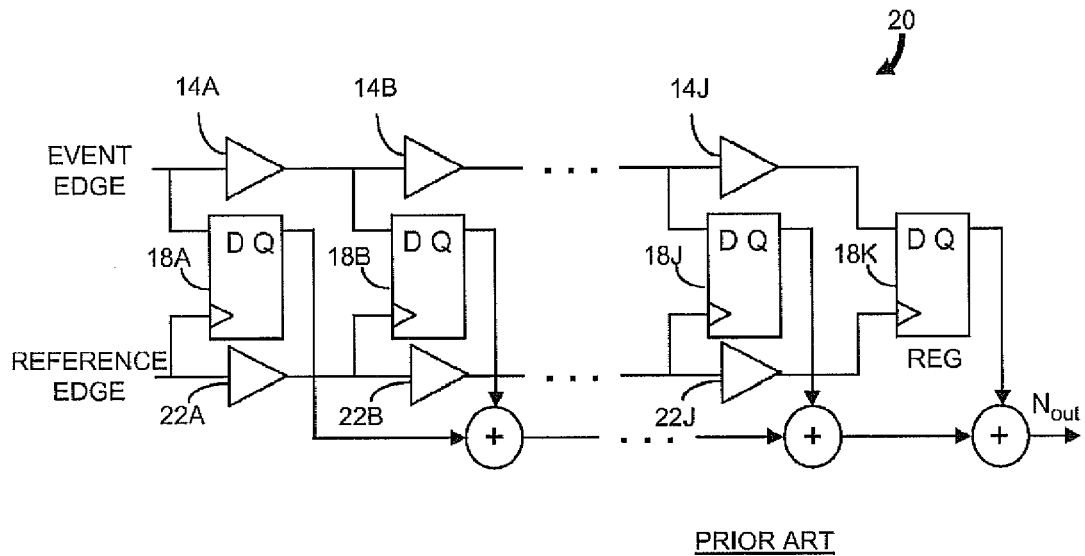
FIG. 3 is a diagram of a vernier delay as is known in the art.
Figure 4:
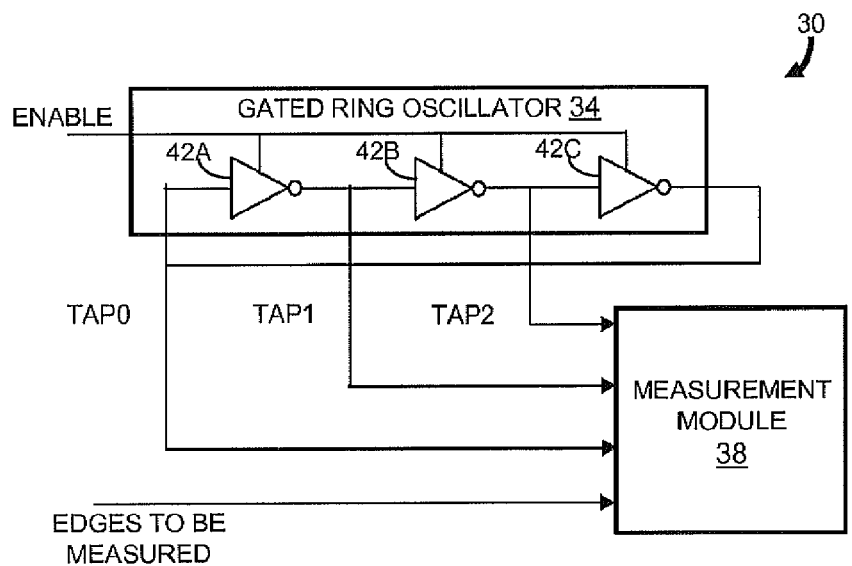
FIG. 4 illustrates an embodiment of a TDC according to the invention.

FIG. 4 illustrates an embodiment of a TDC 30 according to the invention. The TDC 30 includes a gated ring oscillator (GRO) 34 and a measurement module 38. The GRO 34 includes a plurality of delay elements 42A, 42B and 42C (generally 42, only three shown for clarity) illustrated as digital inverters although other forms of delay elements are contemplated. Unlike TDCs employing conventional oscillator structures which lose their state information for inactive gaps in the time measurement window, the GRO 34 of the illustrated TDC 30 counts the oscillation cycles during the measurement time and holds the state of the oscillator between measurements. By holding the residual output state during the inactive gaps of a longer measurement window, the next measurement "starts in the same place" that the previous measurement ended. The resulting quantization steps are effectively smaller than are possible using standard gate delays. Advantageously, due to the scrambling achieved by mismatch of the delay elements 42 and noise within the GRO 34, the TDC 30 achieves first-order noise shaping and has reduced tone content compared to conventional TDC architectures.

Ideally, upon enabling the GRO 34 for a measurement, oscillation begins immediately at a nominal frequency and, upon disabling the GRO 34, the frequency instantaneously returns to zero and the state of each delay stage in the GRO 34 is preserved (i.e., held at a constant value). A practical GRO, however, has a finite transition time when going between nominal frequency and zero frequency, and a key design goal is to minimize that transition time in order to reduce the impact of noise. Another practical issue is that the GRO delay stages are susceptible to non-ideal circuit issues such as charge injection, leakage currents, and noise. Such effects can cause transitions to effectively occur after the GRO is disabled despite best efforts in preserving the state of each delay stage. To accommodate the presence of such "disable mode" transitions, the transition measurement module 38 is designed to include these "disable mode" transitions in the overall transition count so that additional measurement noise is avoided and noise shaping of the time-to-digital converter quantization noise is maintained.

Figure 5:
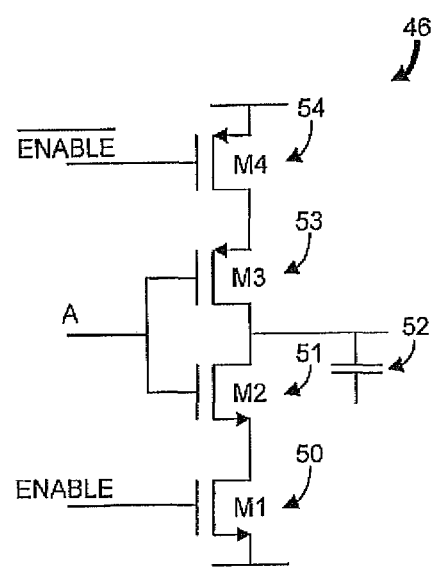
FIG. 5 illustrates a digital inverter that can be used for each delay element in the gated ring oscillator of FIG. 4.

FIG. 5 shows an example of a digital inverter 46 that can be used for each delay element 42 in the GRO 34. The digital inverter 46 includes two NMOS transistors 50 and 51 (M1 and M2) and two PMOS transistors 53 and 54 (M3 and M4). The propagation path A is coupled to the gate of the M2 NMOS transistor 51 and the gate of the M3 PMOS transistor 53. The digital inverter 46 is gated according to an enable signal and a complementary enable signal applied to the gates of the M1 NMOS transistor 50 and the M4 PMOS transistor 54, respectively.

Referring also to FIG. 4, the GRO 34 ideally turns on and off in response to the enable signal ENABLE which has a pulse width equal to the particular time interval to be measured. The quantized output is determined from the number of edge transitions of the individual delay element 42 for each enabled time interval. For reduced clocking speeds, a larger number of delay elements are used to permit ample time for resetting the clocked registers in the measurement module 38.

Figure 6:
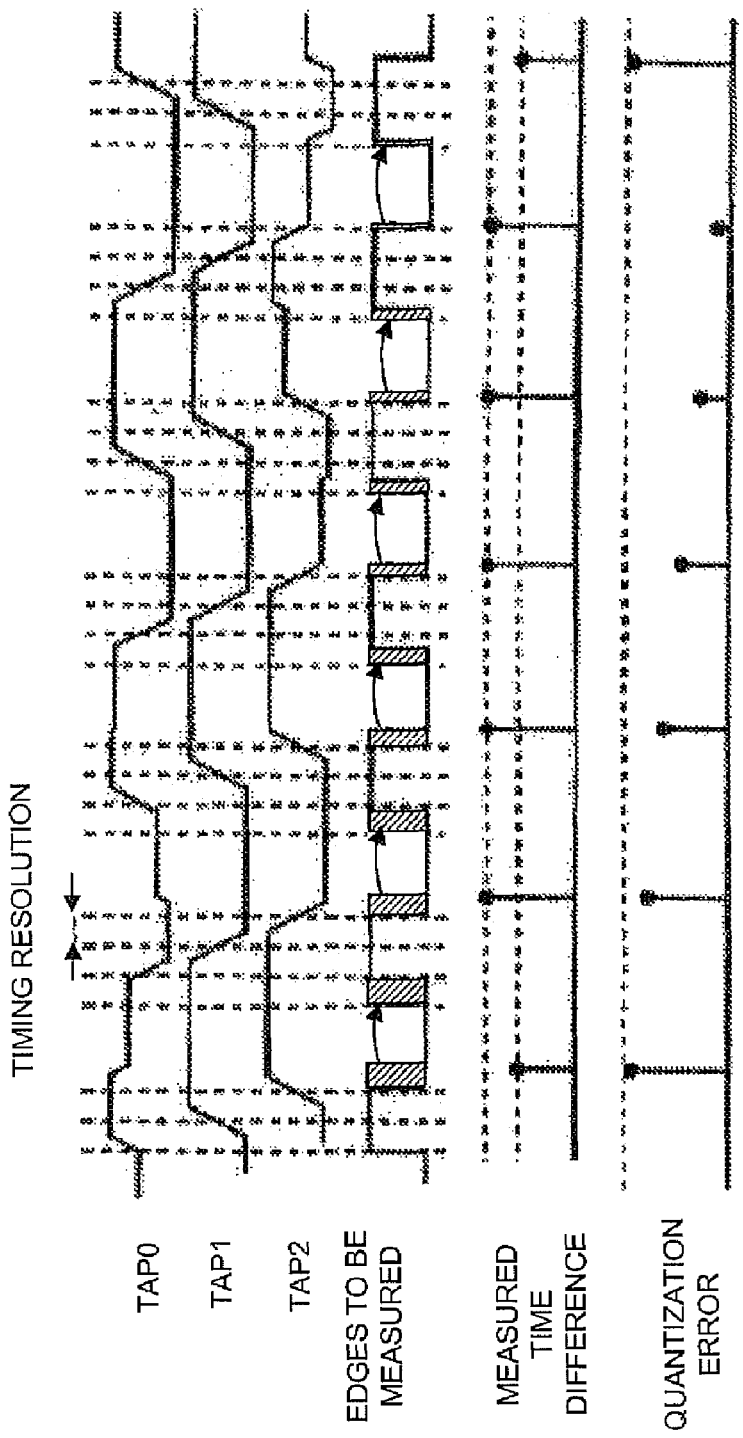
FIG. 6 shows a timing diagram for operation of the TDC of FIG. 4.

The timing diagram of FIG. 6 shows one example of operation of the TDC 30. The states TAP0, TAP1 and TAP2 of the delay elements 42, the measured time difference, and the quantization error are shown as a function of time relative to the edges to be measured. During an enabled state of operation, the output state of each delay element 42 is a function of its input state and transient switching characteristics. During the disabled state of operation, operation of the delay elements 42 is suspended and the output state of each delay element 42 is ideally held at a constant value. Referring also to FIG. 5, if the leakage currents through the transistors 50 and 54 are negligible during the disabled state, the output states of the delay elements 42 do not change because the current path is removed from the output and charge is conserved on the output capacitance 52. Thus the phase of the GRO 34 is preserved during the disabled time and phase integration resumes when the enable signal is reasserted. As a result, the residual phase (as shown as the shaded region at the end of each sample) is carried over to the next quantized phase sample (as shown by the shaded region at the beginning of the each subsequent sample). In effect, the common component of residual error between the current and previous sample is canceled to achieve first-order noise shaping of the quantization noise in the quantized time measurement.

In an alternative embodiment, differential operation is used to minimize rise and fall time mismatches by limiting clocking to a positive edge transition or a negative edge transition. In addition, the delay elements are not limited to a highly-digital form such as digital inverters. Rather, the delay elements need only to provide a delay and to have the ability to be enabled and disabled in such a way that state information is preserved during the inactive measurement gaps. The delay can therefore be either fixed or variable according to the system requirements.

Various modifications can be used to further improve performance of the TDC of the invention. For example, the time interval of interest can be altered, linearly or otherwise, before application of the timing signals or the enable signal to the GRO to obtain improved quantization noise performance.

Figure 7:
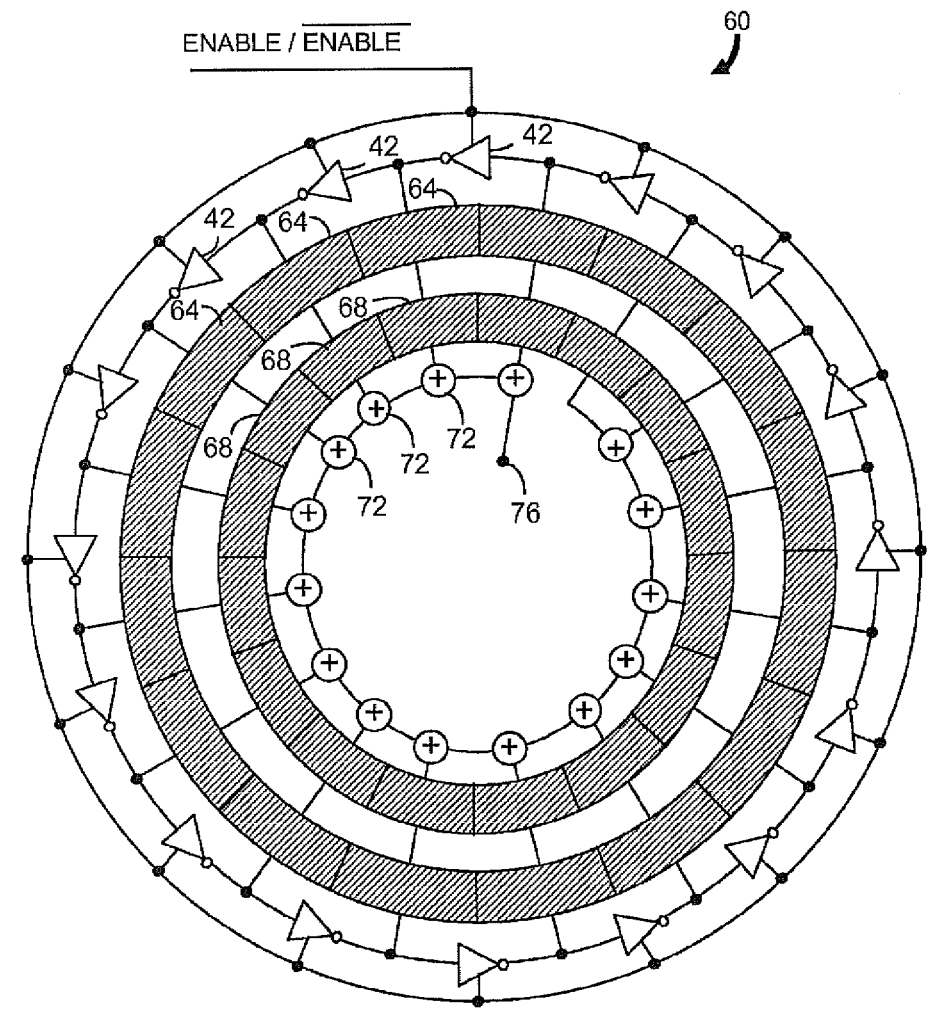
FIG. 7 illustrates another embodiment of a TDC in accordance with the invention.

FIG. 7 is a schematic illustration of a GRO 60 used in another embodiment of a TDC in accordance with the invention. The GRO 60 includes a plurality of delay elements (shown as digital inverters 42) arranged serially in a ring configuration. The output of each delay element 42 is in communication with a measurement module that observes the state of the GRO 60 and provides a quantized time output. Although the measurement module can be configured in a number of ways, in this case each delay element 42 is in communication with a quantization latch 64 which in turn is in communication with a counter 68 having reset capability. Each counter 68 is coupled through a respective summing node or "adder" 72. The adders 72 are serially connected to a quantized time output node 76.

Figure 8:
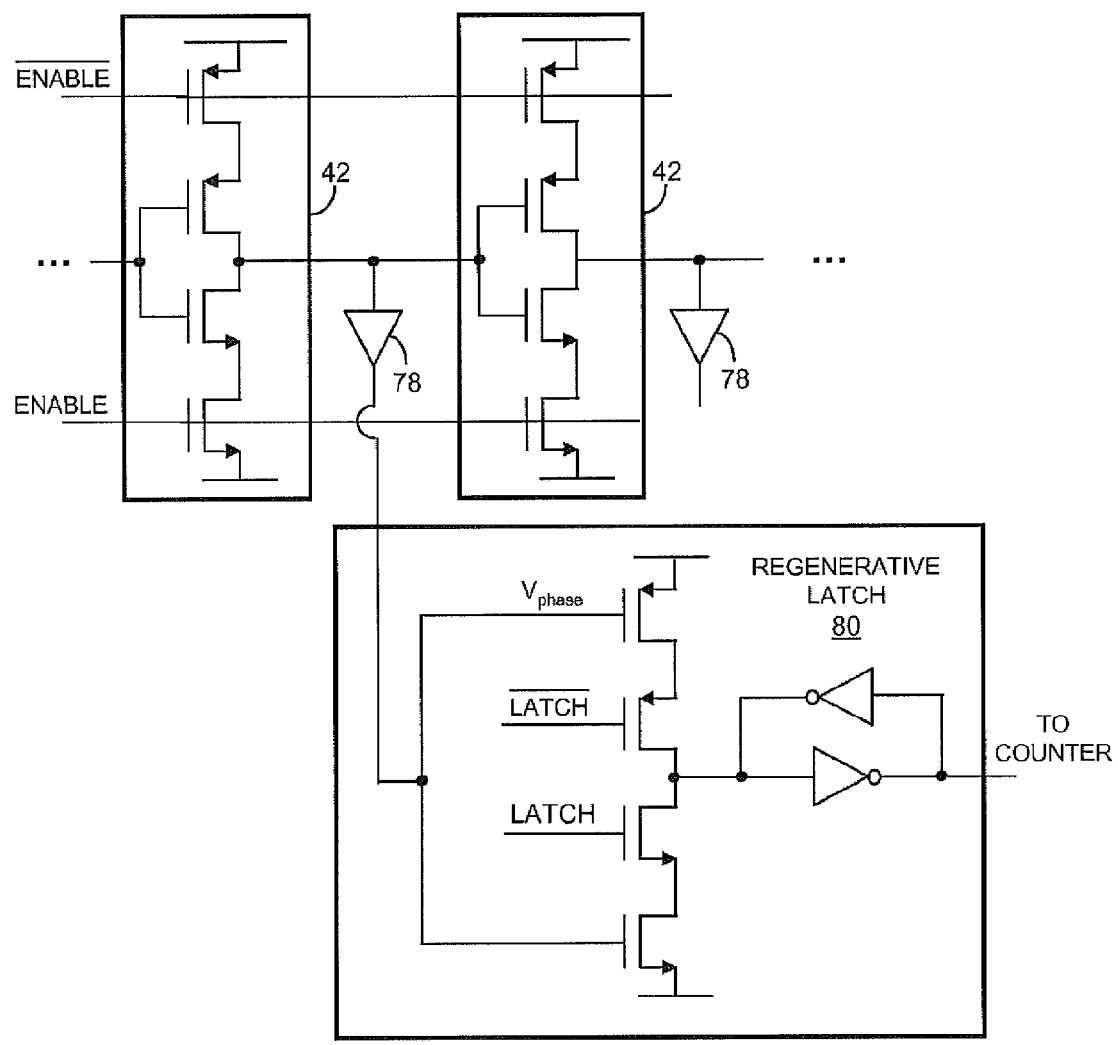
FIG. 8 illustrates a buffer and a regenerative latch that can be used between the output of each delay element and counter of the TDC of FIG. 7.

When the GRO 60 is enabled, the outputs of the delay elements 42 are provided to the counters 68 through a transparent latch 80. Each counter 68 determines a counter value that indicates the number of positive and negative edge transitions for its delay element 42. When the GRO 60 is disabled, each counter value is registered into its adder 72 to be summed with the other counter values. The counters 68 are reset to zero before the next time the GRO 60 is enabled. One or more of the delay element 42 is in transition when the oscillation is suspended, therefore changes above and below the quantization threshold can be mistaken by the corresponding counters as a GRO transition. To prevent this occurrence, a buffer 78 and a regenerative transparent latch 80 are provided between the output of each delay element 42 and its counter 68 as shown in FIG. 8. The buffer 78 provides gain and reverse isolation. The latch 80 restricts the time window during which the signal applied to a counter 68 can cause a transition and also ensures a quantization decision through positive feedback. During the disabled periods, if there is change at the output of any of the delay elements 42 due to charge injection, drift, leakage, or noise, the counter values are not corrupted. Upon subsequent enablement of the GRO 60, any delay element 42 in transition is allowed to complete its transition before the latch 80 is activated such that the counter 68 only observes a single transition event for a single transition of the delay element 42.

The GRO as described in the embodiments above can be limited by distortion of the residual error that occurs when the GRO is disabled and enabled. In particular, the time for the disabled GRO to resume oscillation upon an enable assertion depends in a non-linear manner on the voltages, i.e., the internal state, of the GRO stored during the disabled time. Due to this distortion, the GRO may be unable to accurately transfer the oscillation state from one sample to the next, thus adversely affecting the noise shaping.

The key issue is that propagation delay of the edges through the different stages of the ring oscillator is impacted by the gating operation, which then corrupts the state of the oscillator such that its starting point in a new measurement cycle does not match the stopping point of the previous measurement cycle. The resulting state corruption, in turn, prevents proper progression of the ring oscillator edges through their respective delay stages as the GRO is repeatedly gated on and off, and thereby leads to dead zone behavior.

Figure 9A:
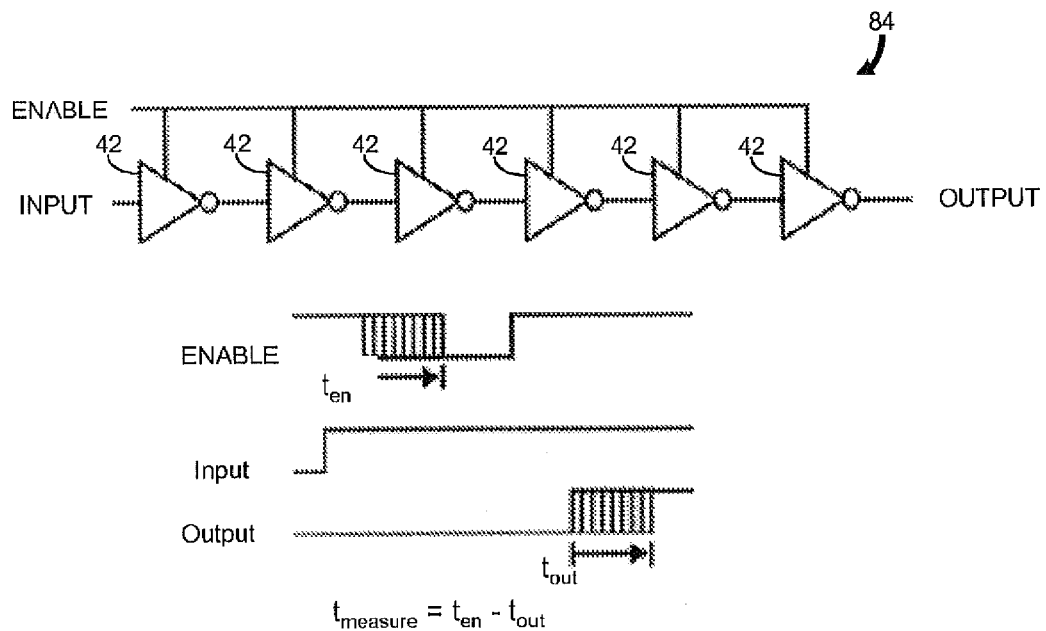
FIG. 9A shows how a signal edge propagates through a series of inverters in a gated ring oscillator and FIG. 9B shows how the time difference $t_{out}-t_{en}$ in FIG. 9A is a function of the disabled state of the gated ring oscillator.
Figure 9B:
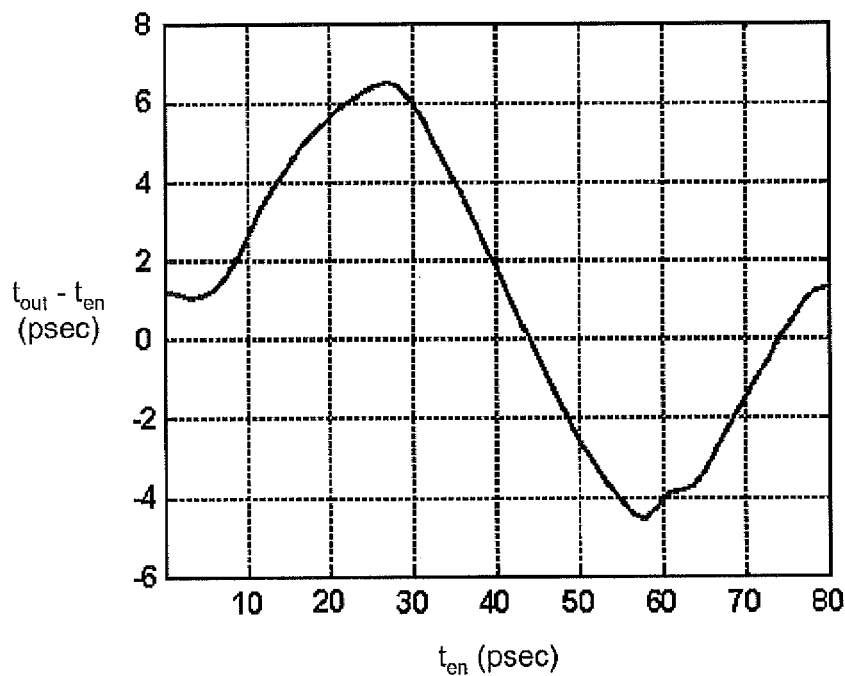

To illustrate this behavior, FIG. 9A shows a GRO 84 where a signal edge (shown as "Input") propagates through a series of inverters 42. The time at which the GRO 84 is disabled is independently defined as $t_{en}$, and the time at which the last inverter undergoes an edge transition (shown as "Output") is $t_{out}$. Ideally, the time difference $t_{out}-t_{en}$ is a constant value as graphically described by the correspondence between the Input edge and the Output edge, as this means that the GRO startup time is constant. As shown in FIG. 9B, the time difference $t_{out}-t_{en}$ is not constant, but is instead a function of the disabled state of the GRO 84. The residual error distortion is a complex function of non-linear transistor behavior across both rising and falling edges, and accounts for the period of the illustrated time difference function being twice the delay caused by a delay element 42.

Figure 10:
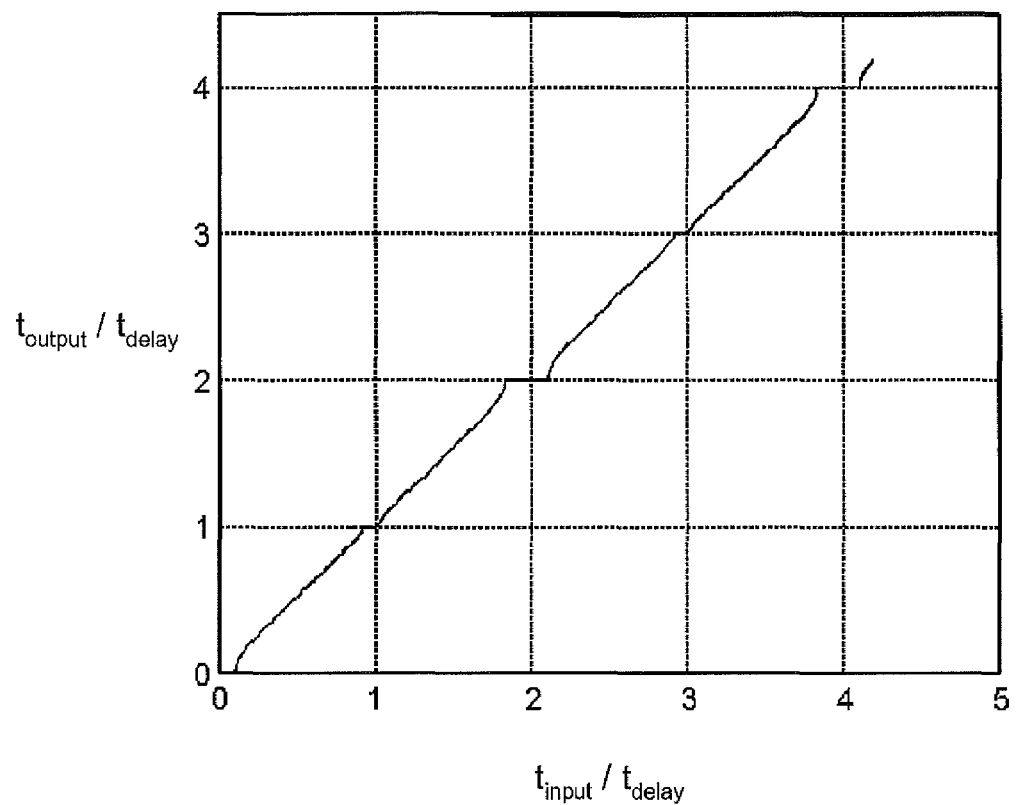
FIG. 10 shows a DC transfer curve for a gated ring oscillator.

One effect of the distortion are the "deadzones" in the DC transfer curve shown in FIG. 10 where the normalized digital output $$\frac{t_{output}}{t_{delay}}$$

of a TDC is shown as a function of a normalized input signal $$\frac{t_{input}}{t_{delay}}.$$

For input signal levels approximately equal to a single delay element, a GRO is unable to distinguish small changes in time with respect to the Input edge (see FIG. 9) so that the TDC simply provides an integer value without any noise shaping behavior. Deadzones in the illustrated transfer curve are evident near and at integer values of the normalized input signal $$\frac{t_{input}}{t_{delay}}.$$

Figure 11A:
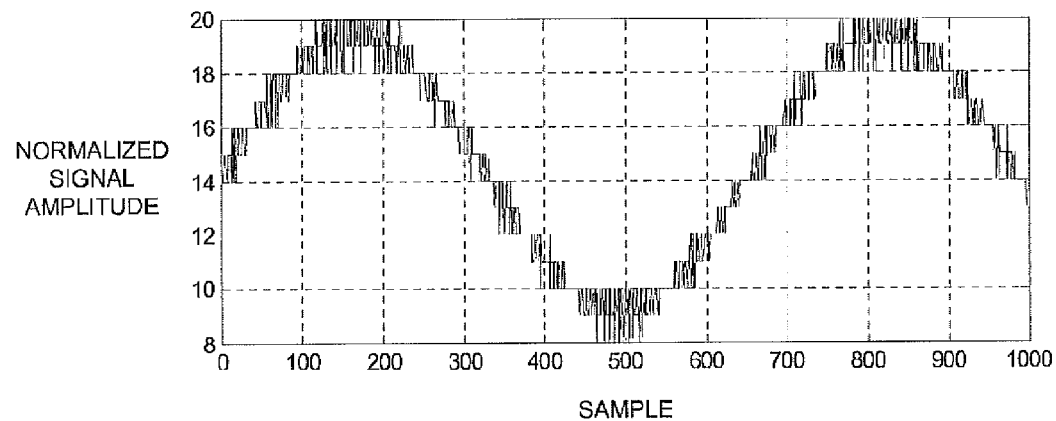
FIG. 11A shows a quantized signal in the time domain and FIG. 11B shows the frequency spectrum of the signal of FIG. 11A.
Figure 11B:
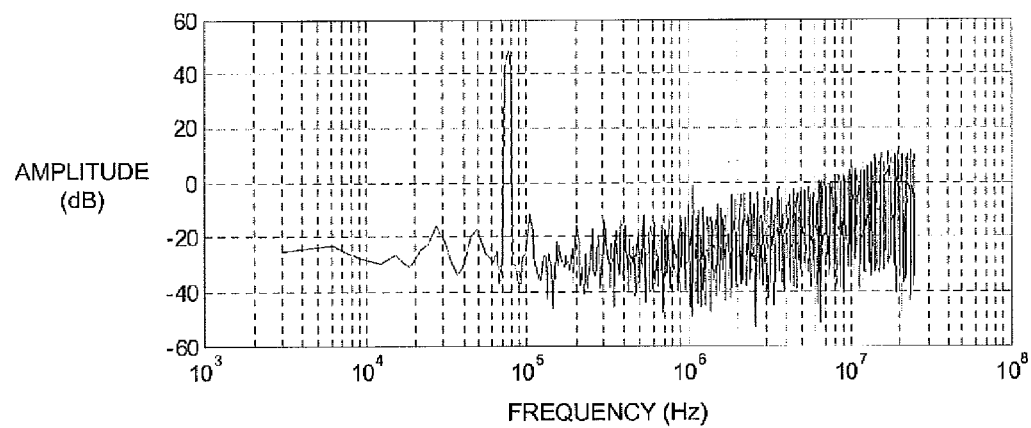

The effect of this distortion can also be observed in the frequency domain. FIG. 11A shows a quantized signal having a fundamental frequency of approximately 75 KHz in the time domain. The non-linearity is not readily observable; however, FIG. 11B shows the frequency spectrum of the same signal. The effect of the non-linearity can be seen in the frequency spurs and in the increased noise floor (−25 dB to −30 dB). Thus it is desirable to reduce the effect of the non-linearity, ideally to less than the thermal noise of the GRO.

A preferred embodiment of a GRO that yields improved resolution and reduced non-linearity with respect to the GRO embodiment described above is shown in FIG. 12A. In this improved configuration of the GRO 100, each delay stage has multiple weighted delay elements 42. Connections to the multiple delay elements 42 are made to multiple delay stage outputs from around the GRO 100 with a connection matrix 104 in such a manner that the effective delay for each stage decreases as described without the gating functionality in S. S. Mohan et al., "Differential Ring Oscillators with Multipath Delay Stages," IEEE 2005 Custom Integrated Circuits Conference, pp. 503-506, incorporated by reference herein in its entirety.

Figure 12A:
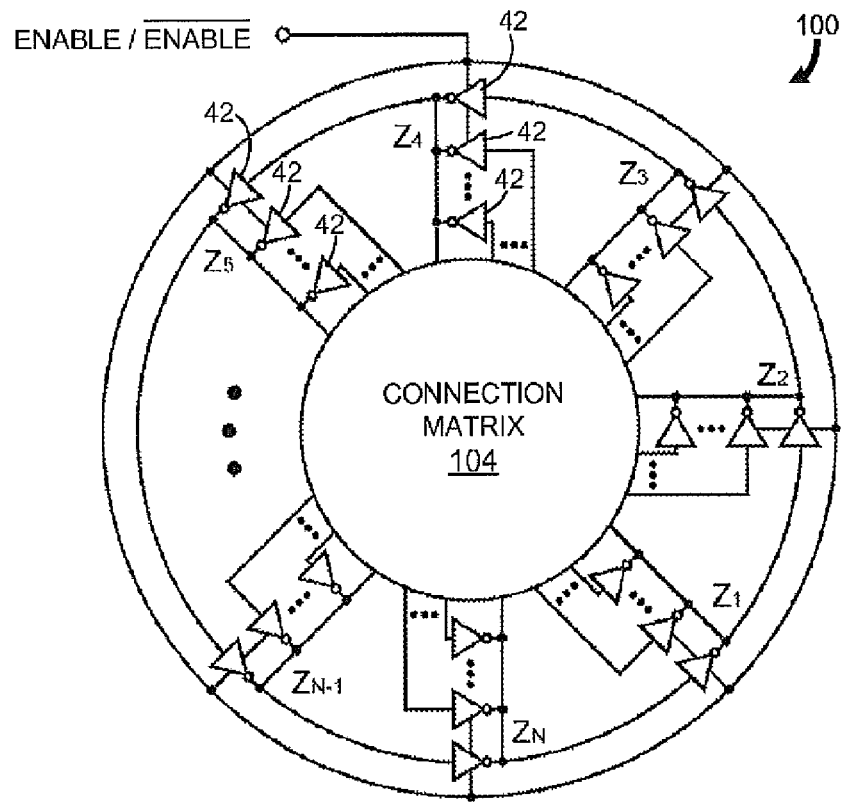
FIG. 12A shows a gated ring oscillator for an embodiment of a TDC according to the invention and FIG. 12B illustrates a portion of the gated ring oscillator of FIG. 12A implemented in a PMOS and NMOS transistor configuration.
Figure 12B:
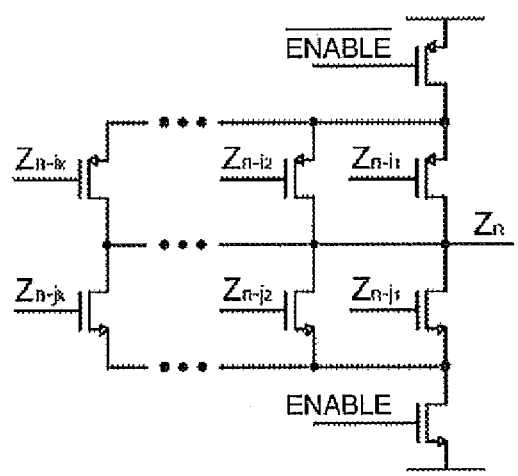

FIG. 12B illustrates a configuration for the delay stage used in the GRO 100 of FIG. 12A in which PMOS and NMOS transistors function as the delay elements 42. In this configuration the number of delay elements 42, the transistor sizes, and the connection matrix 104 are engineered to obtain an effective delay that is a factor of about 5-10 times smaller than the serial GRO 60 shown in FIG. 7 and described above.

The desired mode of oscillation, called the primary mode, is when the GRO 100 transitions occur in a serial sequence similar to the serial GRO 60, albeit much closer together. However, due to the more complex structure of the multipath GRO 100, modes of oscillation other than the primary mode can occur as well, and need to be suppressed for optimal operation of the GRO 100. It has been found that a prime number N of delay stages helps to suppress other modes. In addition, the connection of delay elements to delay stage outputs can be approximately restricted to the preceding N/3 stages, with at least a minimal weighting of the elements to be distributed across these N/3 stages.

The reduced propagation delay achieved using the illustrated configuration can result in a reduction of 10 dB or more in TDC error. The non-linearity resulting from the enabling and disabling of the GRO 100 is also reduced. In effect, many stages are in transition at any one time, therefore the non-linear time to enable and disable is less affected by a single voltage waveform, leading to an improvement of 10 dB or more. Quantization noise approaches the thermal noise, leading to more linear behavior in feedback loop applications.

Due to the increased speed of the multipath GRO, the counting of transitions from each delay element 42 with the measurement module as described above for the serial GRO 60 and shown in FIG. 7 may be difficult or inefficient. Alternatively, the state of a GRO operating in its primary mode can be found by counting the transitions of one output and sampling the entire oscillator output states. Using this configuration of the measurement module, the predictability of the GRO output state progression is relied upon to accurately map the observed oscillator state into measured time or phase. Because a larger number of GRO output stages can be in transition during the disabled measurement time, it is difficult to predict or establish a reliable GRO output stage transition pattern across the entire oscillator. To address this problem, the GRO output stages can be sub-divided and connected to appropriately sub-divided measurement module cells that each has a unique and predictable mapping from GRO state to time or phase. The full measurement module then sums together the measurement module cell outputs to result in the total time-to-digital converter output.

A method for ensuring that transitions are not miscounted or corrupted during the measurement is an important part of achieving noise shaping, and was described above with reference to FIG. 7. Another method to remove glitches from the critical counter inputs is to utilize the monotonically increasing phases of the GRO. That is, the GRO phase can only increase, and therefore any transition glitches without significant motion of the GRO state can safely be ignored. Digital logic within the measurement module that crudely observes the GRO state can be combined with a transparent latch to accomplish this de-glitching.

The invention also contemplates other GRO configurations in which variations on the serial or multipath GRO are utilized. In one such alternative configuration, multiple GROs are coupled to operate in sequence so that there is a fraction of a delay offset between each pair of GROs. The coupling can be accomplished using an appropriate connection matrix to achieve a finer resolution than is possible with a single GRO. Still other configurations of multiple ring oscillators used to achieve resolution improvement as are known in the art are contemplated for use in the GRO of the invention.

While the invention has been shown and described with reference to specific embodiments, it should be understood by those skilled in the art that various changes in form and detail may be made therein without departing from the spirit and scope of the invention.

What is claimed is:

1. A gated ring oscillator time-to-digital converter for modifying time-to-digital converter quantization noise, the gated ring oscillator time-to-digital converter comprising:
   a plurality of delay stages wherein each delay stage has an enable terminal, the enable terminal receives an enable signal that has two states, an enable state and a disable state, being coupled to said enable terminal of said delay stages, the enable signal having a pulse with a duration substantially equal to a time period to be measured, each delay stage having multiple weighted delay elements and connection to said multiple delay elements are made to the outputs of said delay stages using a connection matrix in such a manner that reduces the delay for each delay stage, and
   a measurement module to determine a number of transitions of the delay stages, said delay stages being interconnected to allow sustained transitions to propagate through the delay stages when said enable signal is in the enable state, and preservation of a state of the gated ring oscillator when said enable signal is in the disable state allowing the phase of the gated ring oscillator to be preserved and phase integration to resume when the enable signal is asserted, thus holding the state of the gated ring oscillator during the disable state allowing the measurement module to start another measurement using the state of the gated ring oscillator from a previous measurement, wherein the state represents a voltage on a capacitance of the delay stage.

2. The gated ring oscillator time-to-digital converter of claim 1 wherein each delay stage has at least one input terminal and at least one output terminal, each input terminal being in communication with at least one output terminal of a different stage according to a ring oscillator topology.

3. The gated ring oscillator time-to-digital converter of claim 1 wherein each delay stage comprises at least one digital inverter.

4. The gated ring oscillator time-to-digital converter of claim 1 wherein each delay stage imparts a constant delay to the propagation of the signal.

5. The gated ring oscillator time-to-digital converter of claim 1 wherein each delay stage is configured to provide a variable delay to the propagation of the signal.

6. The gated ring oscillator time-to-digital converter of claim 1 wherein the measurement module further comprises:
   a plurality of quantization latches each in communication with at least one of the delay stages; and
   at least one counter in communication with a respective one of the quantization latches.

7. The gated ring oscillator of claim 6 wherein the quantization latches are regenerative latches.

8. The gated ring oscillator of claim 7 further comprising a plurality of buffers each disposed between a delay stage and a respective one of the regenerative latches.

9. A method for determining a measurement time, the measurement time having a plurality of enable periods to be included in the determination and at least one disable period to be excluded from the determination, the method comprising:

enabling propagation of a transitioning signal through a plurality of delay stages at a first enable time, the delay stages being interconnected to allow sustained transitions to propagate through the delay stages during the enable time and preservation of a state of the delay stages during a disable time allowing the phase of a gated ring oscillator to be preserved and phase integration to resume when an enable signal is asserted having a pulse with a duration substantially equal to a time period to be measured, each delay stage having multiple weighted delay elements and connection to said multiple delay elements are made to the outputs of said delay stages using a connection matrix in such a manner that reduces the delay for each delay stage;

disabling the propagation of the transitioning signal through the delay stages at a disable time;

storing the state of the delay stages at the disable time; and enabling the propagation of the transitioning signal through the delay stages at a second enable time, wherein the propagation resumes at the state of the delay stages stored at the disable time allowing another measurement time to start using the stored state of the delay stages from a previous measurement time and wherein the state represents a voltage on a capacitance of said delay stage.

* * * * *